United States Patent [19]

Niinobu et al.

[11] Patent Number: 5,082,800

[45] Date of Patent: Jan. 21, 1992

[54] METHOD OF FORMING PATTERN IN MANUFACTURING SEMICONDUCTOR DEVICE

[75] Inventors: Koji Niinobu; Futoshi Tokunoh, both of Fukuoka, Japan

[73] Assignee: Mitsubishi Denki Kabushiki Kaisha, Tokyo, Japan

[21] Appl. No.: 653,928

[22] Filed: Feb. 12, 1991

[30] Foreign Application Priority Data

Mar. 7, 1990 [JP] Japan .................. 2-56834

[51] Int. Cl.⁵ .................. H01L 21/58; H01L 21/328
[52] U.S. Cl. .................. 437/180; 437/6; 437/194; 437/248; 437/925; 437/902
[58] Field of Search .......... 437/6, 8, 31, 180, 187, 437/194, 225, 245, 902, 915, 925, 247, 248; 148/DIG. 102, DIG. 106, DIG. 12

[56] References Cited

U.S. PATENT DOCUMENTS

| | | | |
|---|---|---|---|
| 3,657,611 | 4/1972 | Yaneda | 437/902 |
| 4,009,059 | 2/1977 | Nakata | 437/902 |
| 4,141,136 | 2/1979 | Henry et al. | 437/902 |
| 4,370,180 | 1/1983 | Azuma et al. | 437/187 |
| 4,792,530 | 12/1988 | Nilarp | 437/6 |
| 4,942,139 | 7/1990 | Korwin-Pawlowski | 437/180 |

FOREIGN PATENT DOCUMENTS

| | | | |
|---|---|---|---|
| 2231282 | 12/1973 | Fed. Rep. of Germany | 437/248 |
| 2452786 | 11/1980 | France | 437/902 |

Primary Examiner—Brian E. Hearn
Assistant Examiner—T. N. Quach
Attorney, Agent, or Firm—Lowe, Price, Leblanc & Becker

[57] ABSTRACT

A method of manufacturing a semiconductor device including a semiconductor substrate (10) comprising n-emitter regions (14a-14c) formed before the substrate is brazed on a molybdenum plate (1). Due to the difference between respective thermal expansion coefficients of silicon and molybdenum, the substrate is warped through the brazing process and the horizontal positions of the n-emitter regions are shifted. A mask pattern for patterning an aluminum layer (31) is corrected in position to prevent a patterned aluminum layer from extending over the peripheral areas of the n-emitter regions.

17 Claims, 11 Drawing Sheets

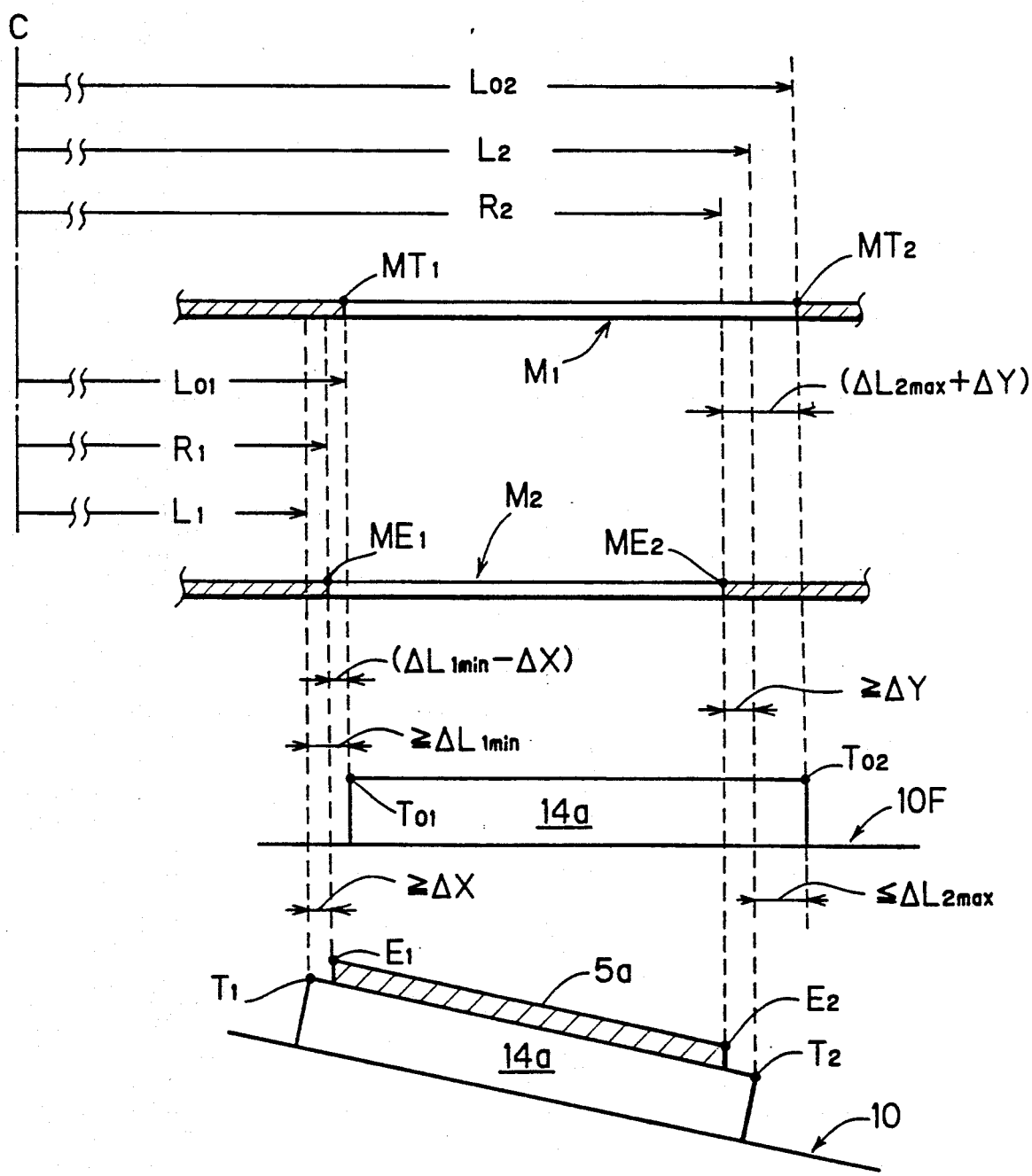

METHOD OF FORMING PATTERN IN MANUFACTURING SEMICONDUCTOR DEVICE

BACKGROUND OF THE INVENTION

1. Field of the Invention

The present invention relates to a method of accurately forming a desired pattern on a major surface of a semiconductor substrate which has been warped because of a brazing on a metal plate or the like, and also relates to a method of manufacturing a semiconductor device through the patterning procedure.

2. Description of Background Art

As well known in the art, a high-power semiconductor device often has a semiconductor substrate fixed on a metal plate. FIG. 8 is a schematic sectional view showing a semiconductor substrate 51 employed in a gate turn-off thyristor (GTO), where a bottom major surface of the semiconductor substrate 51 is brazed to a molybdenum plate 53 through an anode electrode 52 serving as a brazing material layer. The molybdenum plate 53 functions as a supporting plate or a reinforcing plate for the semiconductor substrate 51. On a top major surface of the semiconductor substrate 51, a plurality of emitter regions 54 are disposed. The emitter regions 54 are concentrically arranged around the center C of the semiconductor substrate 51, and cathode electrodes 55 are formed on them. For the convenience of explanation, a layer structure of active regions in the semiconductor substrate 51 and an arrangement of gate electrodes on the top major surface are omitted in FIG. 8. On the other hand, a mask 56 used in patterning the emitter regions 54 and a mask 57 used in patterning the cathode electrodes 55 are shown in FIG. 8.

In a process of brazing the semiconductor substrate 51 to the molybdenum plate 53, both of them are high in temperature. When aluminum is used as brazing material, the semiconductor substrate 51 and the molybdenum plate 53 are heated to a temperature equal to or higher than 660° C., which is a fusing point of aluminum. Then, an assembly 58 consisting of the semiconductor substrate 51 and the molybdenum plate 53 is cooled to around the room temperature after the process of brazing, and correspondingly, the assembly 58 is warped in accordance with a difference between their respective thermal expansion coefficients.

When the semiconductor substrate 51 is made of silicon, its thermal expansion coefficient is $4.15 \times 10^{-6}/K$, while the thermal expansion coefficient of the molybdenum plate 53 is $5.1 \times 10^{-6}/K$, which is larger than the former. This causes the assembly 58 to be warped with the semiconductor substrate 51 curved in a convex shape after the cooling down. In FIG. 8, a part of an assembly 59 which is identical with the assembly 58 after warped is shown by a broken line. For convenience, however, the warping is exaggerated in FIG. 8.

On the other hand, with regard to the emitter regions 54 and cathode electrodes 55 on the top major surface of the semiconductor substrate 51, the formers are formed before the above-mentioned brazing process, while the latters are formed after the brazing process. Thus, even if a registration within the patterns of the masks 56 and 57 is perfect, the cathode electrodes 55 are not accurately superimposed on the emitter regions 54 because of the warping of the semiconductor substrate 51, so that misregistration is caused therebetween.

When the misregistration is relatively small, there arises not much of a problem, but when it is large, a part of the cathode electrode 55 is formed out the emitter regions 54, as shown in an enlarged plan view of FIG. 9(a) and an enlarged sectional view of FIG. 9(b). As a result, the emitter regions 54 and other active regions (not shown) around the same are short circuited, and consequently the GTO does not work well.

The important thing is that the degree of the misregistration depends upon various factors and does not keep constant. More particularly, the misregistration of the emitter regions 54 and the cathode electrodes 55 depends upon the distances between the emitter regions 54 and the center C in FIG. 8. This is because the curvature of the assembly 59 is relatively small around the center of the substrate 51 while the curvature is relatively large at regions near to the circumferential edge of the substrate 51, as understood in FIG. 8. The warping of the assembly 59 also varies depending upon the thickness of the molybdenum plate 53 and the thickness of the semiconductor substrate 51.

For example, when the semiconductor substrate 51 is 0.6 mm in thickness and the molybdenum plate 53 is 66 mm in diameter, the warping of the semiconductor substrate 51 varies in accordance with the thickness of the molybdenum plate 53 as shown in FIG. 10, where the "degree of warping" in FIG. 10 means a transformation amount of the semiconductor substrate 51 at its edges. Accordingly, the degree of the misregistration of the emitter regions 54 and the cathode electrodes 55 also depends upon the thickness of the molybdenum plate 53 and the semiconductor substrate 51.

Even in the same conditions, many semiconductor substrates have a statistical dispersion in warping degree when they are brazed, but do not have an identical value. Thus, the degrees of the disagreement in positions of the cathode electrodes 55 are not the same, and therefore, the misregistration cannot be prevented by uniformly changing the positions where the cathode electrodes 55 are formed.

Such a problem becomes serious when the patterns on the semiconductor substrate 51 are made fine to enhance the integration in the device structure. In the GTO, the fine patterns are necessary to enhance a turn-off capability, but it causes the cathode electrodes 55 to be formed out the emitter regions 54 even when misregistration therebetween is very little. With semiconductor devices other than the GTO, it is also necessary to prevent patterns from being in misregistration because of warping of a semiconductor substrate when the patterns are made fine.

SUMMARY OF THE INVENTION

The present invention is directed to a method of forming a material pattern on a major surface of a warped substrate.

According to the present invention, the method comprises the steps of: (a) determining an allowable limit value of warp in the substrate; (b) determining a position of a region on the major surface at which the material pattern is to be formed under an imaginary condition that the substrate is flat; (c) determining a reference position on the major surface of the substrate; (d) correcting the position of the region as a function of the allowable limit value and a distance between the region and the reference position to thereby determine a corrected position of the region; (e) obtaining a mask having a mask pattern at a position corresponding to the corrected position; (f) forming a material layer on the major surface of the substrate; and (g) patterning the material layer with the mask while adjusting respective orientations of the material layer and the mask at the reference position to thereby obtain the material pattern on the major surface.

Preferably, the step (a) comprises the steps of: (a-1) determining an allowable maximum value of warp in the substrate; and (a-2) estimating a minimum value of warp in the substrate to obtain an estimated minimum value. The allowable limit value of warp is obtained in the form of a combination of the allowable maximum value and the estimated minimum value.

In a preferred embodiment of the present invention, the material pattern has a front edge facing to the reference position and a rear edge opposite to the front edge, while the mask pattern has a first edge corresponding to the front edge and a second edge corresponding to the rear edge. The position of the region is represented by respective positions of the first and second edges.

Preferably, the step (d) comprises the steps of: (d-1) correcting a position of the first edge as a function of the estimated minimum value and a distance between the position of the first edge and the reference position to thereby obtain a corrected position of the first edge; and (d-2) correcting a position of the second edge as a function of the allowable maximum value and a distance between the position of the second edge and the reference position to thereby obtain a corrected position of the second edge. The corrected position of the region is represented by the corrected positions of the first and second edges.

The present invention is also effective in the case where the material pattern includes a plurality of unit patterns.

The present invention is also directed to a method of manufacturing a semiconductor device.

According to the present invention, the method comprises the steps of: (a) preparing first and second masks on which first and second masking patterns are formed; (b) forming a first material pattern on a top major surface of a semiconductor substrate using the first mask; (c) brazing a bottom major surface of the semiconductor substrate on a metal plate, in which the semiconductor substrate is warped due to a difference between respective thermal expansion coefficients of the semiconductor substrate and the metal plate; and (d) forming a second material pattern on the top major surface of the semiconductor substrate using the second mask, the second material pattern being adjusted to the first material pattern in position.

In this method, the step (a) comprises the steps of: (a-1) determining, with reference to the first masking pattern in the first masking pattern, a position of a region in the top major surface on which the second material pattern is to be formed; (a-2) correcting the position of the regions a function of a predetermined allowable limit value of warp in the semiconductor substrate and a distance between the region and a predetermined reference position ton the top major surface to thereby determine a corrected position of the region; and (a-3) obtaining the second mask in which the masking pattern represents the corrected position of the region.

Correspondingly, the step (d) comprises the steps of: (d-1) forming a material layer on the top major surface; and (d-2) patterning the material layer with the second mask while adjusting respective orientations of the material layer and the second mask at the reference position.

According to the present invention, assuming that a substrate is flat, a position where a pattern is to be formed is determined, and then the position is corrected allowing for misregistration because of warping of the substrate.

Upon the correction, the distance between the pattern and a reference position (for example, the center) of a major surface of the substrate is taken into consideration. This is because the reference position is a registration point of the orientations of the substrate and a mask, and because as the pattern is positioned further away from the specified position where there is no misregistration, the degree of the misregistration becomes larger.

The above-mentioned correction is carried out also allowing for an allowable limit value of the warping of the substrate. The allowable limit value is predetermined in accordance with the dispersion of the degrees of warping of several substrates.

Thus, with a substrate warped to a degree less than the allowable limit value, patterns can be formed in any positions on the substrate with almost the same accuracy.

The upper limit of the warping of the substrate may be determined based upon a judgement on how far the warping can be allowable. When the warping is significantly great, various inconveniences arise except the misregistration of the pattern, and the substrate is usually regarded as defective. Therefore, there is no need to make pattern allowing for significantly great warping, but the allowable maximum value is determined allowing for such limitation.

On the other hand, the lower limit may be determined as follows: The degree of the warping of the substrate depends upon various factors, and it is usual that finite warping is caused in the substrate as long as a treatment which is just the cause of the warping (e.g., a brazing treatment) is performed. When the substrate is warped under predetermined conditions in a certain range, the warping should be larger than a substantial minimum value in accordance with the range of the conditions.

For example, when the semiconductor substrate is brazed onto a metal plate, the minimum value of the warping of the substrate can be estimated by determining materials of components, their dimensions and a temperature range in brazing. The value can be also obtained by estimating in an experiment in advance.

Thus, the lower limit of the warping to be taken into consideration can be specified through the estimation.

In this way, when the allowable maximum value and estimated minimum value on the warping are specified, the former is employed for correcting the position of the rear edge of the pattern, while the latter is employed for correcting the position of the front edge.

As will be described later, there exists a rule in the direction of the misregistration caused by the warping of the substrate, and hence, shifting both the front and rear edges in the direction, it is possible to compensate the misregistration without making the pattern width excessively small.

In a method of manufacturing a semiconductor device according to the present invention, the patterns formed before and after the substrate is warped are substantially adjusted with each other in position by correcting mask patterns. Upon formation of the pattern with the warped substrate, its position is corrected as described above and the degree of the misregistration between the patterns can keep within an allowable error even if semiconductor substrates have a dispersion in the degree of warping.

Accordingly, it is an object of the present invention to make it possible to form a pattern accurately on each of substrates warped because of a certain treatment even if the substrates have a dispersion in degree of the warping.

It is another object of the present invention to manufacture a semiconductor device in which respective patterns formed before and after a substrate is warped are substantially aligned with each other, even if degree of the warping in substrates has a dispersion.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1C is a diagram showing relations of the positions of pattern edges on masks;

DETAILED DESCRIPTION OF THE PREFERRED EMBODIMENT

A. Structure and Operation of an Objective Semiconductor Device

Figure 2:
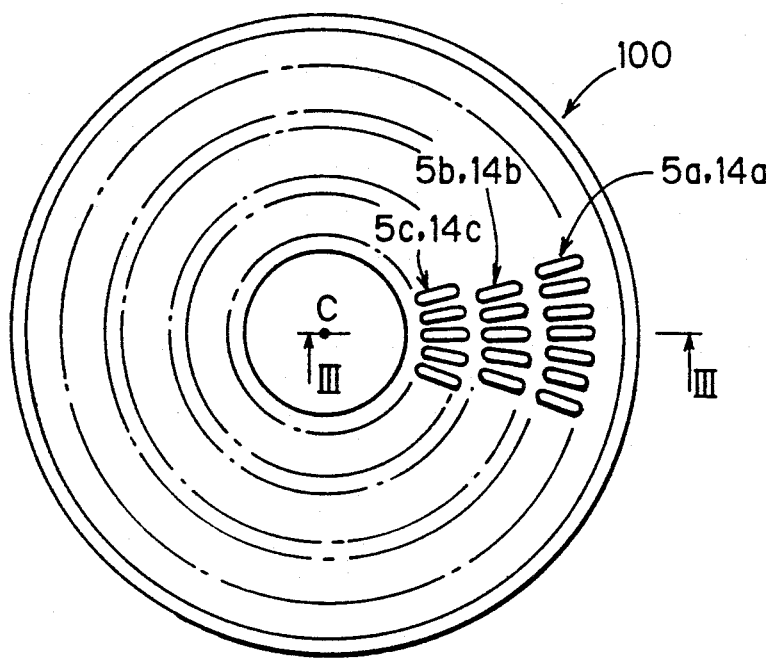
FIG. 2 is a schematic plan view showing a gate turn-off thyristor (GTO) manufactured in accordance with the present invention.
Figure 3A:
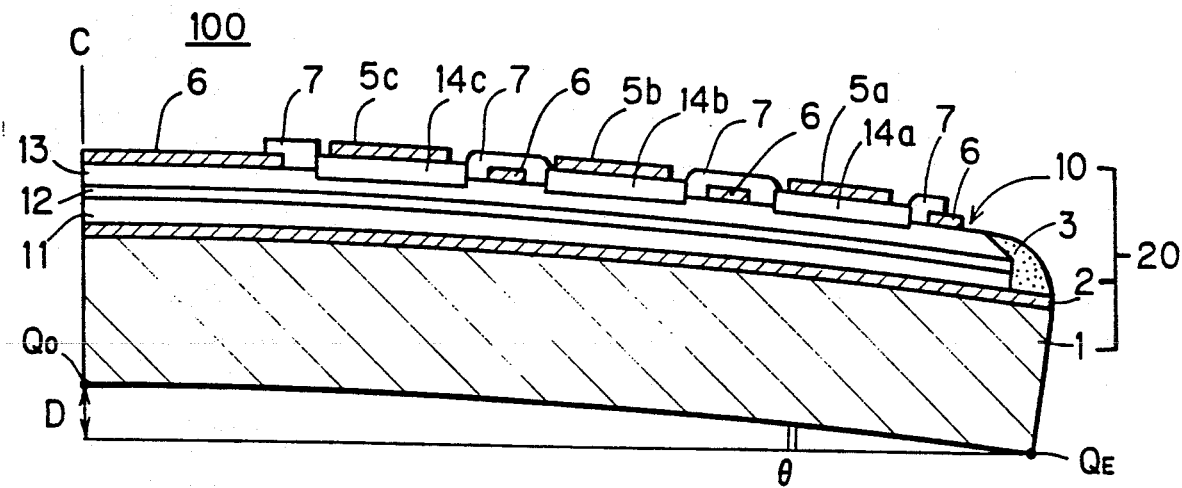
FIGS. 3A and 3B are partial sectional views showing GTOs warped to different degrees.

FIG. 2 is a schematic plan view showing a GTO element 100 manufactured according to a preferred embodiment of the present invention, while FIG. 3A is an enlarged sectional view along the line III—III of FIG. 2. The GTO 100 comprises a semiconductor substrate 10 (FIG. 3A), and the semiconductor substrate 10 has its bottom major surface brazed to a molybdenum plate 1 by an anode electrode 2 which also serves as a brazing material layer. The molybdenum plate 1 functions as a supporting plate or a reinforcing plate of the semiconductor substrate 10. The anode electrode or brazing material layer 2 is made of aluminum. The semiconductor substrate 10 comprises a p-emitter region 11, an n-base region 12 and a p-base region 13, and a plurality of n-emitter regions 14a through 14c are concentrically disposed on the p-base region 13. Cathode electrodes 5a through 5c made of aluminum are formed on the n-emitter regions 14a through 14c, respectively. Gate electrodes 6 are formed in an alternate arrangement with the n-emitter regions 14a through 14c. The gate electrodes 6 are covered with insulating films 7 on the top major surface of the substrate 10 except its center portion. An outer edge portion of the semiconductor substrate 10 is protected by silicone rubber 3.

The GTO element 100 operates as follows: First, in a turn-on operation, while main voltage is being applied across the anode electrode 2 and the cathode electrodes 14a through 14c, control voltage is applied between the gate electrodes 6 and the cathode electrode 5a through 5c so that p-n junctions between the p-base region 13 and the n-emitter regions 14a through 14c is forward-biased. In response to the voltages, holes move into the n-emitter regions 14a through 14c from the p-base region 13, and accordingly, electrons move into the p-base region 13 from the n-emitter regions 14a through 14c. Moreover, excessive electrons are supplied also to the n-base region 12 by amplification of in an npn-transistor composed of the n-emitter regions 14a through 14c, p-base region 13 and p-base region 12.

As a result, the excessive electrons stay in the n-base region 12, and in order to neutralize them, the same amount of holes are supplied to the n-base region 12 from the p-emitter region 11. Furthermore, excessive electrons are ;supplied to the p-base region 13 by amplification in a pnp-transistor composed of the p-emitter region 11, n-base region 12 and p-base region.

Thus, once the GTO element 100 turns on, the npn- and pnp-transistors mutually drive each other, and hence main current continues to flow between the anode electrode 2 and the cathode electrodes 14a through 14c even if the current supply to the gate electrode 6 turns off.

On the other hand, in a turn-off operation, voltage is applied across the gate electrode 6 and the cathode electrodes 5a through 5c so that a pn-junction composed of the p-base region 13 and n-emitter regions 14a through 14c is reversely biased. Then, the holes which should flow from the n-base region 12 to the n-emitter regions 14a through 14c are drawn out through the gate electrode 6 when they pass through the p-base region 13. The drawing-out is started with the holes closest to the gate electrode 6. Then, the holes which have reached the n-emitter regions 14a through 14c are gathered up in the center portions of the n-emitter regions 14a through 14c, and eventually the holes no longer reach the n-emitter regions 14a through 14c. As a result, electrons also no longer move from the n-emitter regions 14a through 14c to the p-base region 13, and the GTO element 100 turns off.

B. Warping of Substrate and Principles of Patterning

Because of the difference between thermal expansion coefficients of the semiconductor substrate 10 and the molybdenum plate 1, an assembly 20 is warped when it is brazed. An amount of the warping throughout the assembly 20 can be expressed by a difference D in height between a center point $Q_O$ of the bottom surface of the molybdenum plate 1 corresponding to the center C of the semiconductor substrate 1 and a point $Q_E$ on an edge of the bottom surface of the molybdenum plate 1. An inclination angle of the bottom surface of the molybdenum plate 1 at the edge point $Q_E$ is denoted as $\theta$.

Figure 3B:
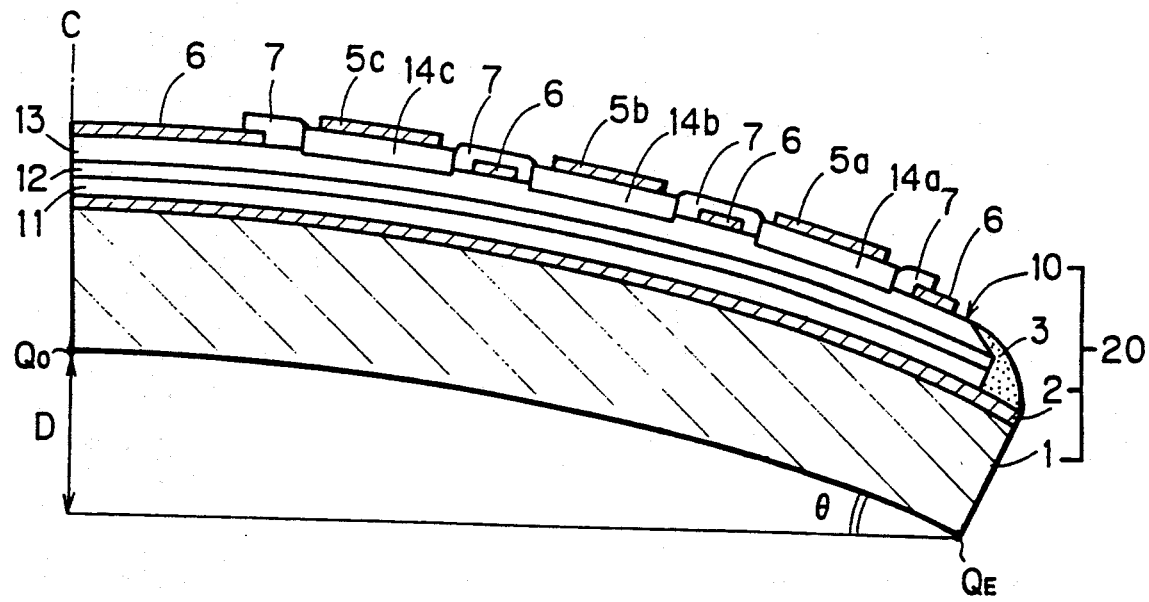

FIG. 3A shows a case in which the warping amount D is relatively small, while FIG. 3B shows a case in which the warping amount D is relatively large. As mentioned below, the n-emitter regions 14a through 14c are formed before a brazing process but the cathode electrodes 5a through 5c are formed after the brazing process. Therefore, in order to attain positional adjustment between the n-emitter regions 14a through 14c and the cathode electrodes 5a through 5c, it is necessary to analyze the relation between the configuration of the semiconductor substrate 10 before the brazing and that after the brazing. Preferably, the situation that the warping amount D varies in accordance with the thickness of the substrate 10 should be taken into consideration upon the analysis. However, in the next section, a case in which the warping amount D does not depend the thickness will be discussed as an advance step of the analysis.

(B-1) Case without Variations in Warping Amount

Figure 4:
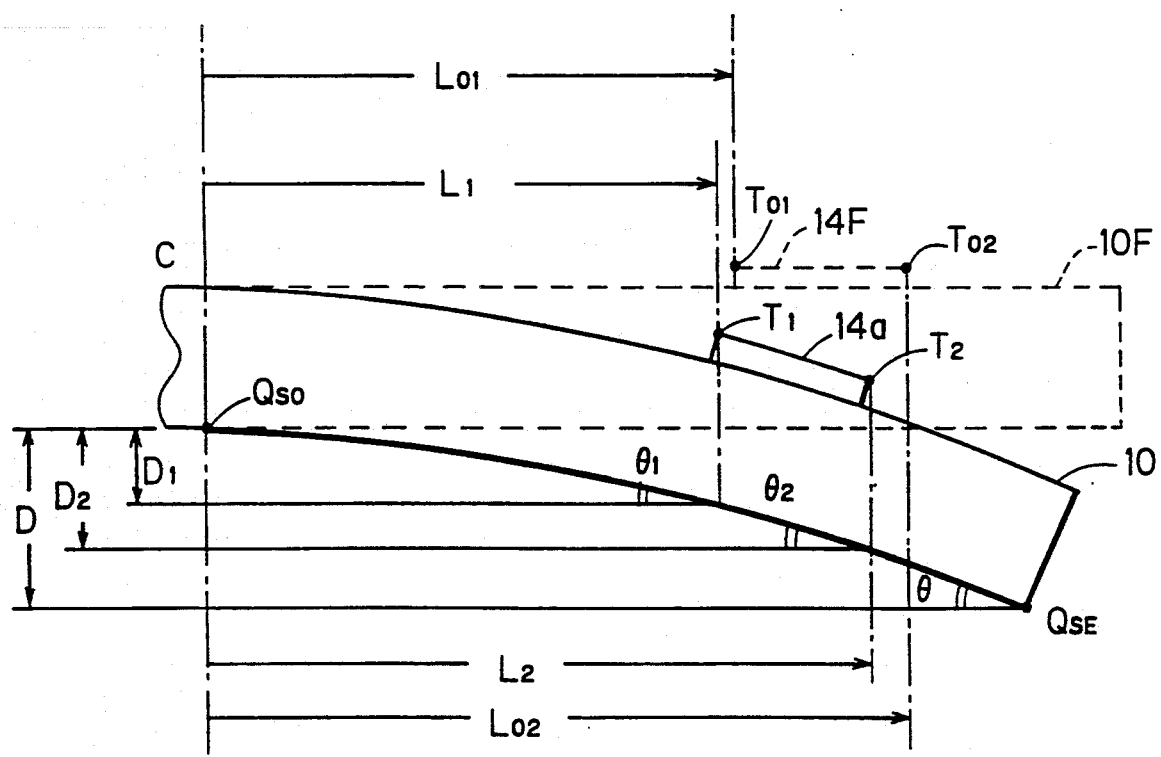
FIGS. 4 through 6 are diagrams showing a principle of calculating a correction amount of the positions of the pattern edges.

FIG. 4 is a diagram showing the relation between respective configurations of the warped semiconductor substrate 10 and a flat semiconductor substrate 10F which has not been warped. In FIG. 4, components unrequired for the explanation are omitted, and only the n-emitter region 14a, which is the outermost one of the n-emitter regions 14a through 14c, is representatively shown in FIG. 3A. The following analysis is for determining how both edges T1 and T2 of the n-emitter region 14a are deviated from the edges $T_{01}$ and $T_{02}$ of an n-emitter region 14F of the flat semiconductor substrate 10F.

The edge $T_{01}$ facing the center C is called as "front edge", while the edge $T_{02}$ oriented in the contrary direction to the center C is called as "rear edge". The warping amount D and the inclination angle $\theta$ is defined in relation to the edge $Q_E$ of the molybdenum plate 1 in FIGS. 3A and 3B, but since the curvatures of the substrate 10 and the molybdenum plate 1 are substantially the same, these amounts D and $\theta$ are defined in relation to an edge $Q_{SE}$ of the substrate 10 in FIG. 4.

A horizontal distance from the front edge $T_{01}$ before the warping and the center C is expressed by $L_{01}$, while another horizontal distance from the front edge $T_1$ after the warping to the center C is expressed by $L_1$. As shown in an enlarged view in FIG. 5, the difference $\Delta L_1$ between the distances $L_{01}$ and $L_1$, which is expressed as:

$$L_1 = L_{01} - L_1 \qquad (1)$$

always keeps a positive value. This is because points on the substrate 10 are always shifted toward the center C from respective corresponding points on the flat substrate 10F.

In order to express the value of the difference $\Delta L_1$ with the warping amount of the substrate 10, a warping amount $D_1$ and an inclination angle $\Delta D_1$ in the position of the front edge $T_1$ are defined as shown in FIG. 4. Also defined is a right triangle TA formed connecting the points $T_{01}$, $Q_1$ and $T_1$ in FIG. 5.

Figure 6:
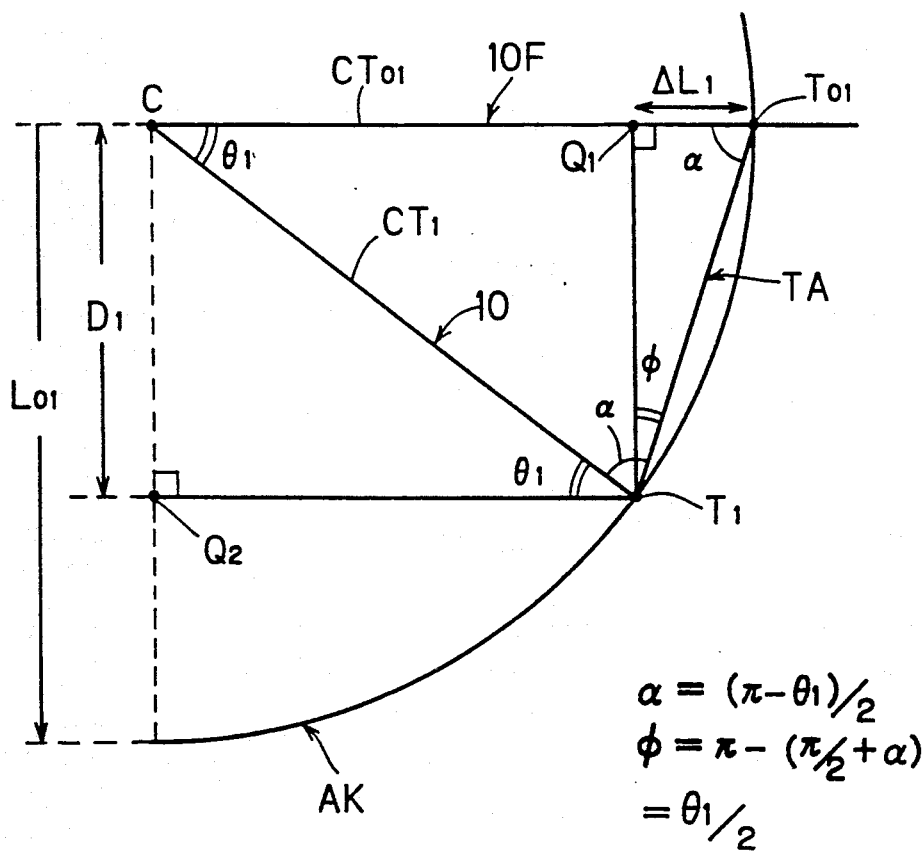

FIG. 6 is a diagram for finding a formula where the difference $\Delta L_1$ is expressed by the warping amount $D_1$ and the inclination angle $\theta_1$. In FIGS. 3A and 3B, the warping of the substrate 10 is exaggerated for convenience, and the degree of warping in the substrate 10 is actually considerably small. Thus, when each part of the warped substrate 10 is locally observed, its major surface is inclined from a horizontal direction and is approximately flat. So far as an area around the n-emitter region 14 is concerned, the top major surface of the substrate 10F can be approximately expressed by a straight line $CT_{01}$ in FIG. 6, and the top major surface of the warped substrate 10 can be approximately expressed by another straight line $CT_1$. With such a linear approximation, the rear edges $T_{01}$ and $T_1$ before and after the warp is caused are on an arc AK which is $L_{01}$ in radius.

Figure 5:
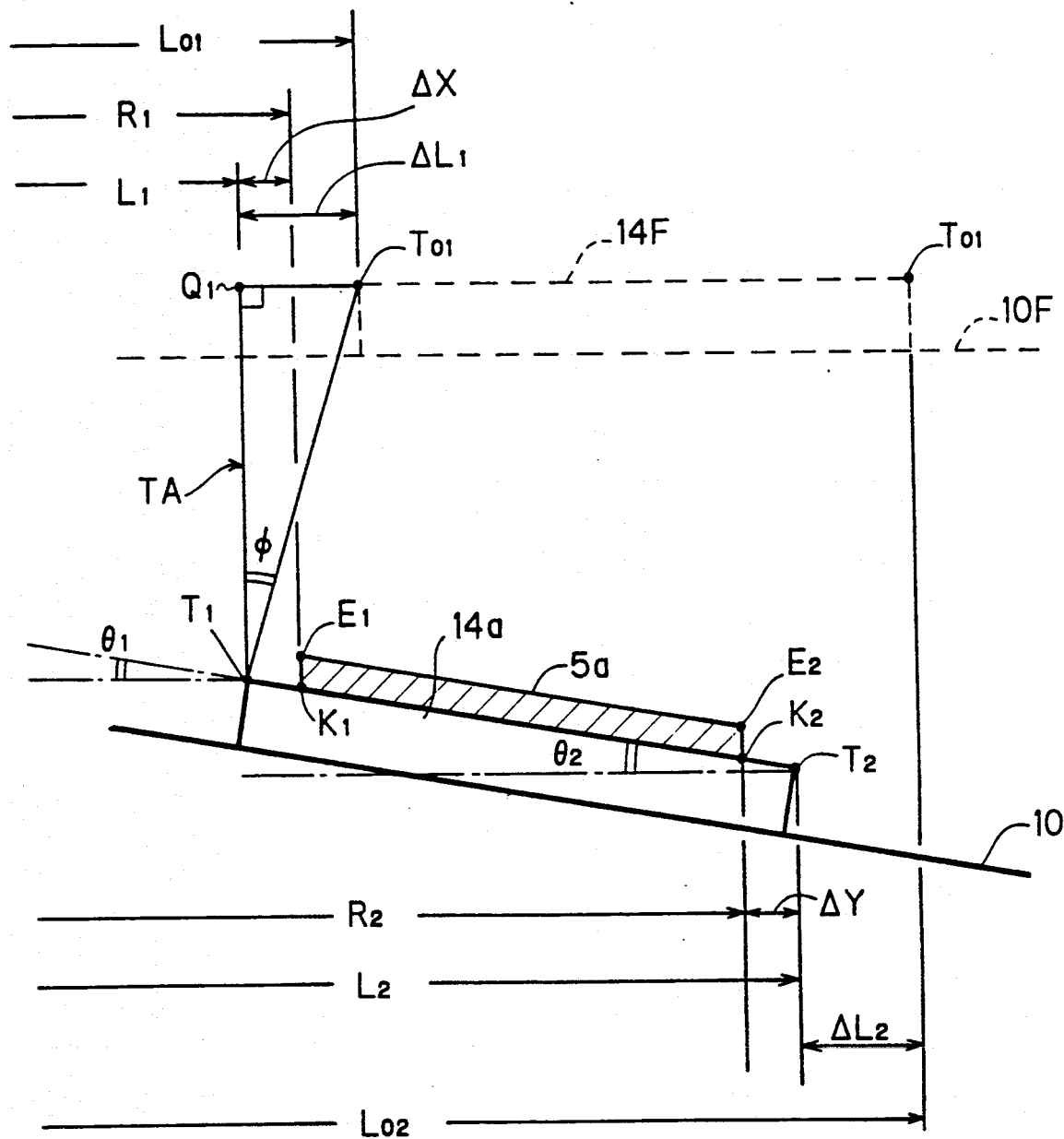

Supposing a horizontal line $T_1Q_2$ passing through the point $T_1$, an angle $CT_1Q_2$ has the same value as the angle $\theta_1$ in FIGS. 4 and 5. Although the angle $\theta_1$ is illustrated in FIGS. 4 and 6 in different size, it is no more than a result of difference in illustration scales in the horizontal direction, and actually, the angles $\theta_1$ in FIGS. 4 through 6 is identical.

Thus, assuming the angle $CT_1Q_1$ in FIG. 6 is $\alpha$, the following equation (2) is obtained in an isosceles triangle $CT_{01}T_1$:

$$1 + \alpha + \alpha = \pi \qquad (2)$$

Similarly, in the triangle TA, or an triangle $Q_1T_{01}T_1$, the following equation (3) is obtained;

$$\alpha + \phi + \pi/2 = \pi \qquad (3)$$

Therefore, obtained are:

$$\alpha = (\pi - \phi_1)/2 \qquad (4)$$

$$= \pi - (\pi/2 + \alpha) = \phi_1/2 \qquad (5)$$

That is, an angle $\phi$ is a half of the angle $\theta_1$ in the linear approximation.

The length of a straight line segment $CQ_2$ in FIG. 6 is equivalent to the warping amount $D_1$ in length, and therefore the following formula (6) is obtained in the triangle TA:

$$L_1 = D_1 \cdot \tan \theta = D_1 \cdot \tan (\theta_1/2) \qquad (6)$$

This formula (6) expresses $\Delta L_1$ with $D_1$ and $\theta_1$.

Referring back to FIG. 5, a misregistration amount $\Delta L_1$ of the front edge $T_{01}$ because of the warping of the substrate 10 is obtained as presented above, but there is often a difference between the misregistration amount $\Delta L_1$ theoretically obtained and an actual amount of the misregistration. Therefore, for a predetermined margin or allowable error limit $\Delta K$, the cathode electrode 5a may be formed on the n-emitter region 14a so that a front edge $E_1$ of the cathode electrode 5a is located in a position $K_1$ which is horizontally away from the center C by the distance $R_1$:

$$R_1 = L_1 + \Delta X = L_{01} - \Delta L_1 + \Delta X \qquad (7)$$

The distance between the point $K_1$ to the point $T_1$ along the top surface of the n-emitter region 14a is exactly as follows:

$$\Delta X \cdot \cos \theta_1 \qquad (8)$$

However, the value of the angle $\theta_1$ is small, so that the value in the formula (8) can approximate $\Delta X$.

The above analysis is concerned with the front edges $T_{01}$ and $T_1$ of the n-emitter region 14a, but with regard also to rear edges $T_{02}$ and $T_2$, similarly, an amount $\Delta L_2$ ($= L_{02} - L_2$) of the misregistration due to the warping of the substrate 10 is obtained as follows:

$$\Delta L_2 = D_2 \cdot \tan(\theta_2/2) \qquad (9)$$

where $D_2$ (FIG. 4) is a warping amount in the rear edge $T_2$ and $\theta_2$ is an inclination angle at the rear edge $T_2$. Allowing also for a margin $\Delta Y$, the point $K_2$ where the rear edge $E_2$ of the cathode electrode $5a$ should be positioned is a point horizontally away from the center C by the distance $R_2$:

$$R_2 = L_{02} - \Delta L_2 - \Delta Y \qquad (10)$$

Since margins $\Delta X$ and $\Delta Y$ are determined so that the cathode electrode $5a$ is not superimposed partly out the n-emitter region $14a$, there is a difference between the formulae (7) and (10) in that the former contains $(+\Delta X)$ as a term while the latter contains $(-\Delta Y)$.

(B-2) Case with Variations in Warping Amount

As previously described, the warping amount of the semiconductor substrate 10 varies dependent upon factors like the thicknesses of the substrate 10 and the molybdenum plate 1. Thus, when the positions where the cathode electrodes $5a$ through $5c$ are to be formed with the premise that there is no change in warping amount, substrates other than the semiconductor substrate having a specified warping amount may possibly have the cathode electrodes $5a$ through $5c$ formed partly out the n-emitter regions $14a$ through $14c$.

Figure 10:
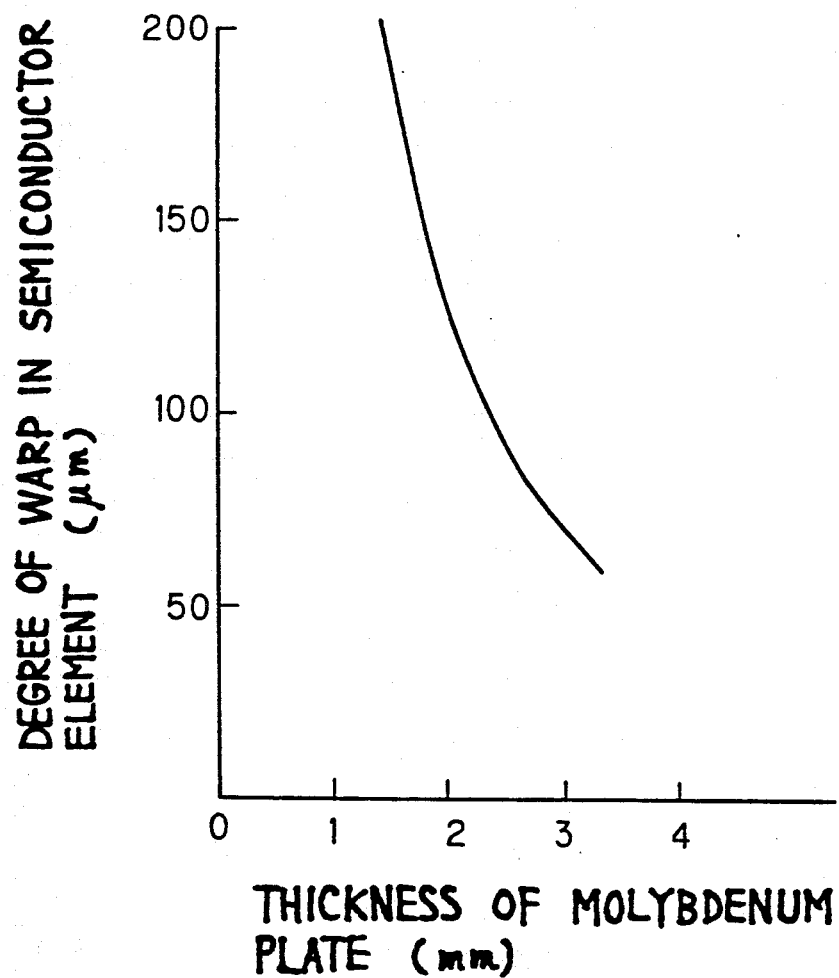
FIG. 10 is a graph showing a variation in the degree of the warping of a semiconductor element in conjunction with the thickness of a molybdenum plate.

However, it is a very annoying work to measure a warping amount of each of a large number of and various kinds of substrates and correct, in accordance with the measured amount, the positions where the the patterns of the cathode electrodes $5a$ through $5c$ are formed. Therefore, according to the present invention, an allowable limit value of warping amounts of substrates is previously determined, so that patterns formed before and after the substrate is warped are coordinated in so far as the warping within a range defined by the allowable limit value. This principle is applied to the preferred embodiment as follows:

First, variations in the warping amount of the substrate 10 after brazed in accordance with factors like the thicknesses of the semiconductor substrate 10 and the molybdenum plate 1 are empirically found. This includes a work, for example, of making a graph as shown in FIG. 10.

Then, the minimum value of the warping amount after the brazing treatment is found within a distribution range of the thicknesses of semiconductor substrates and molybdenum plates employed in manufacturing the GTO 100. The graph shown in FIG. 10 is obtained through an experiment for sample semiconductor substrates and sample molybdenum plates. Although these sample elements are of the same type as the substrate 10 and the molybdenum plate 1, the graph in FIG. 10 is not results of measuring the semiconductor substrate 10 and the molybdenum plate 1 themselves actually employed for manufacturing the GTO 100. Thus, the minimum value of the warping amount specified by such a graph is the "estimated minimum value" or "expected minimum value" of the warping amount for the substrate 10 and the molybdenum plate 1 actually employed.

On the other hand, when the warping amount is significantly large, a semiconductor device thus manufactured often becomes defective even if the misregistration of the patterns is corrected since various problems like cracking in the substrate 10 may be caused other than the misregistration of the patterns. A substrate warped to a significantly great extent may be corrected for the registration of the patterns in vain. Thus, the maximum value of a warping amount range in which semiconductor devices are not generally regarded as defective is set as an "allowable maximum value".

Figure 1A:
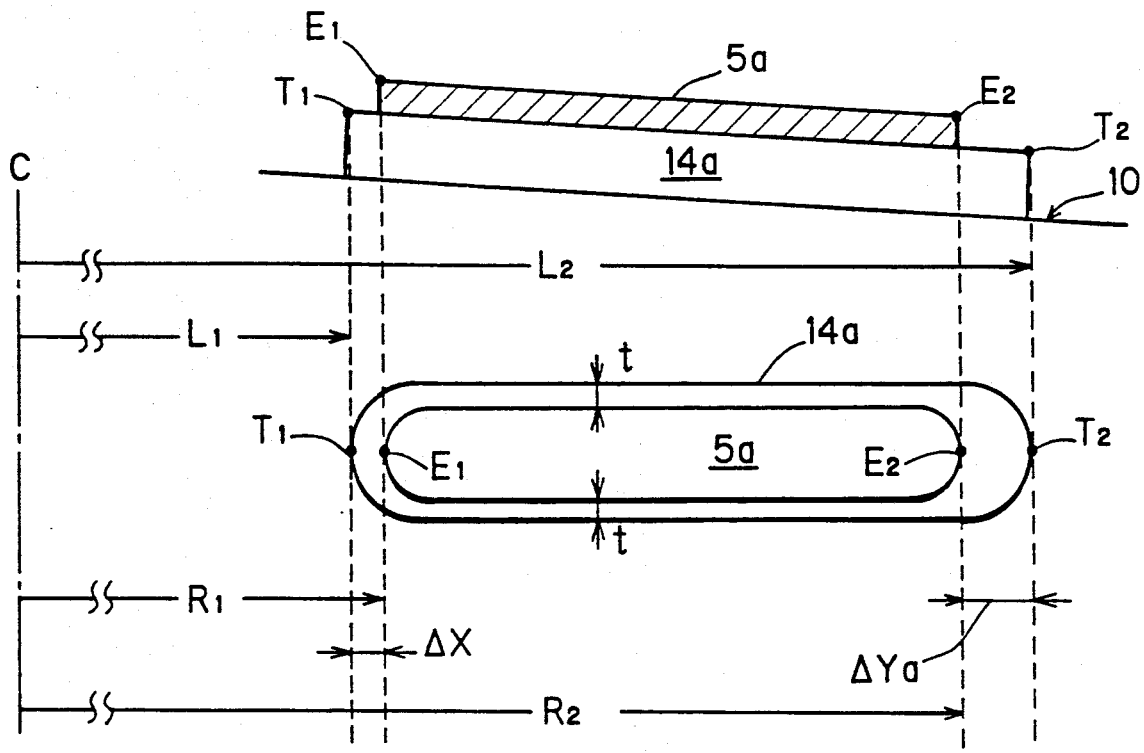
FIGS. 1A and 1B are diagrams showing a state of the registration of patterns formed in accordance with a preferred embodiment of the present invention.
Figure 1B:
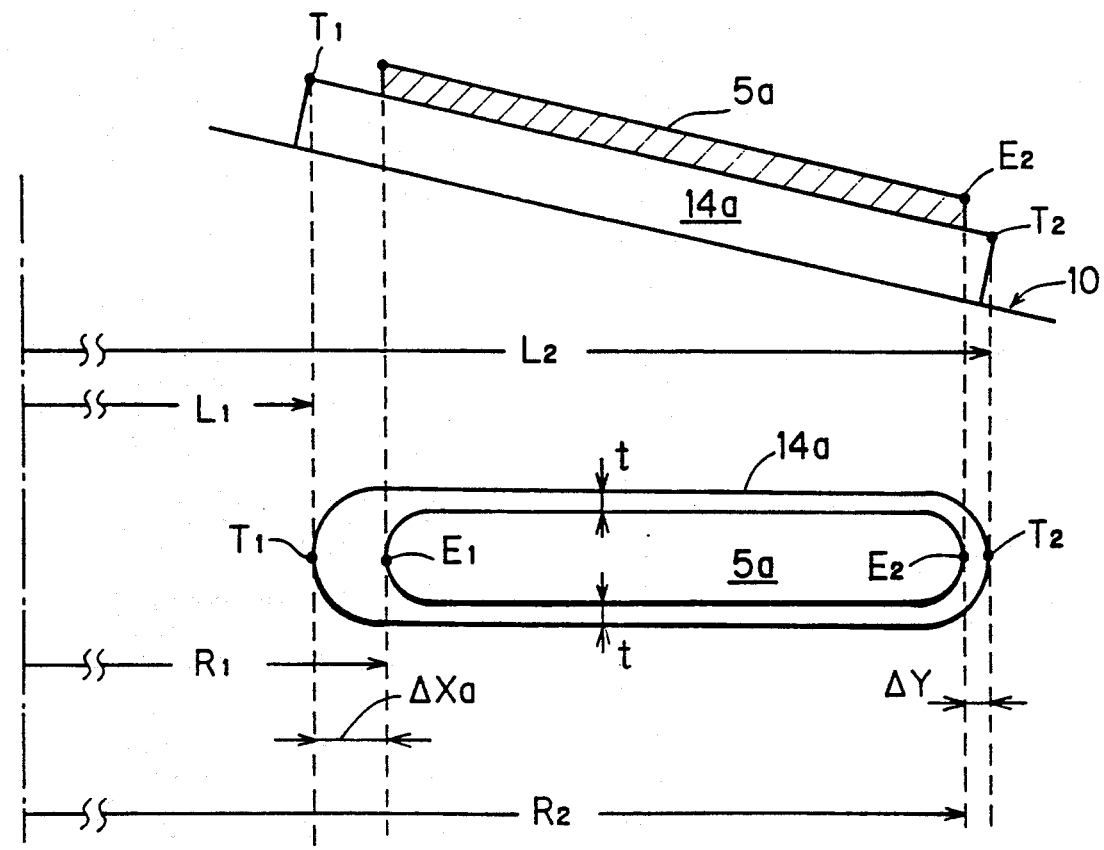

FIGS. 1A and 1B are diagrams showing a principle whereby positions where the cathode electrode $5a$ is formed on the n-emitter region $14a$ are determined in accordance with the allowable maximum value and estimated minimum value thus specified. FIG. 1A shows a case where the substrate is warped by an amount corresponding to the estimated minimum value, while FIG. 1B shows a case where the substrate is warped by an amount corresponding to the allowable maximum value. FIGS. 1A and 1B correspond to the states shown in FIGS. 3A and 3B, respectively. FIG. 1C is a diagram showing a relation between a mask $M_1$ used for forming the n-emitter regions $14a$ through $14c$ and a mask $M_2$ used for forming the electrodes $5a$ through $5c$. The masks $M_1$ and $M_2$ are flat masks.

According to the preferred embodiment, in the mask $M_2$ used to form the pattern of the cathode electrode $5a$ (FIG. 1C), a position $ME_1$ defining a front edge $E_1$ of the electrode $5a$ is positioned away from the center C by the distance $R_1$:

$$R_1 = L_{01} - \Delta L_{1min} + \Delta X \qquad (11)$$

where:

$$\Delta L_{1min} = D_{1min} \cdot \tan(\theta_{1min}/2) \qquad (12)$$

is satisfied, and the warping amount $D_{1min}$ and the inclination angle $\theta_{1min}$ are the values of the warping amount $D_1$ and the inclination angle $\theta_1$ in FIG. 4 when the substrate 10 is warped to an extent corresponding to the estimated minimum value. The definition of the distance $L_{01}$ is similar to that in FIG. 4. The formulae (11) and (12) include $D_{1min}$, $\theta_{1min}$ and $\Delta L_{1min}$ substituted for the values of $D_1$, $\theta_1$ and $\Delta L_1$ in the formulae (7) and (6), respectively.

On the other hand, a position $ME_2$ corresponding to a rear edge $E_2$ of the electrode $5a$ in the mask $M_2$ is determined so as to be away from the center C by the distance $R_2$:

$$R_2 = L_{02} - \Delta L_{2max} - \Delta Y \qquad (13)$$

where:

$$\Delta L_{2max} = D_{2max} \cdot \tan(\theta_{2max}/2) \qquad (14)$$

is satisfied, and $D_{2max}$ and $\theta_{2max}$ are the values of the warping amount $D_2$ and the inclination angle $\theta_2$ in FIG. 4 when the substrate 10 is warped by an amount corresponding to the allowable maximum value. The definition of the distance $L_{02}$ is similar to that in FIG. 4. The formulae (13) and (14) include $D_{2max}$, $\theta_{2max}$ and $\Delta L_{2max}$ substituted for the values of $D_2$, $\theta_2$ and $\Delta L_2$ in the formulae (10) and (9).

The respective values of the $D_{1min}$, $\theta_{1min}$, $D_{2max}$, and $\theta_{2max}$ can be found in advance by actually measuring with sample elements. Furthermore, since the thermal expansion coefficients of the semiconductor substrate 10 and the molybdenum plate 1 are known, it is also possible that the local warping amount and inclination angle are obtained in advance by a theoretical calculation or simulation.

In a process of determining the pattern on the mask $M_2$ with reference to the mask $M_1$ used for forming the n-emitter regions 14a through 14c (referred to as "reference mask" hereinafter), the situation satisfying both the formulae (11) and (13) can be implemented by determining the positions of the front and rear edges $ME_1$ and $ME_2$ of the pattern on the mask $M_2$ such that they are deviated from the positions $MT_1$ and $MT_2$ corresponding to the edges $T_{01}$ and $T_{02}$ on the reference mask $M_1$ by the distances:

$$\Delta L_{1min} + \Delta X \tag{15}$$

$$\Delta L_{2max} - \Delta Y \tag{16}$$

toward the center C, respectively.

Advantages attained by determining the distances $R_1$ and $R_2$ based upon the formulae (11) and (13) will be now described. As shown in FIG. 1A and 1B, as the warping of the substrate 10 is larger, the pattern of the n-emitter region 14a is shifted to the center C. On the contrary, the mask $M_2$ for making electrodes is positioned with the reference of the center C and always keeps horizontal, and hence, the horizontal distances $R_1$ and $R_2$ from the center C to the edge $E_1$ and $E_2$ take constant values independent of the warping amount of the substrate 10. For this reason, as the warping amount of the substrate 10 is larger, the interval between the rear edge $T_2$ of the n-emitter region 14a and the rear edge $E_2$ of the cathode electrode 5a becomes smaller.

Thus, as shown in FIG. 1B, arranging that the interval between the rear edges $T_2$ and $E_2$ is the same as the margin $\Delta Y$ when the substrate 10 is warped by an amount corresponding to the allowable maximum value, the interval between the rear edges $T_2$ and $E_2$ never fail to be larger than the margin $\Delta Y$ for the warping of the allowable maximum value or below (see also FIG. 1C). The formula (13) embodies the condition, and the misregistration amount $\Delta L_{2max}$ according to the allowable maximum value of the warping is employed in the formula (13). Hence, with the warping amount of the allowable maximum value or below, the situation where the rear edge $E_2$ of the cathode electrode 5a expands beyond the rear edge $T_2$ of the n-emitter region 14a can be effectively avoided.

On the other hand, the mutual interval between the front edges $T_1$ and $E_1$ becomes smaller as the substrate 10 is less warped. As shown in FIG. 1A, arranging that the interval between the front edges $T_1$ and $E_1$ is in agreement with the margin $\Delta X$ when the substrate 10 is warped by an amount corresponding to the estimated minimum value, the situation where the front edge $E_1$ of the electrode 5a expands beyond the front edge $T_1$ of the n-emitter region 14a for the warping of the estimated minimum value or over can be effectively avoided. The condition is embodied by the formula (11).

The length of the cathode electrode 5a, which is the distance between the edges $E_1$ and $E_2$, is expressed by subtracting the formula (11) from the formula (13), as follows:

$$R_2 - R_1 = (L_{02} - L_{01}) - (\Delta L_{2max} - \Delta L_{1min}) - (\Delta X - \Delta Y) \tag{17}$$

With the formula (1) and the formula replacing the terms of the formula (1) with the terms for the rear edges, the following equation (18) is obtained.

$$L_{02} - L_{01} = L_2 - L_1 + (\Delta L_2 - \Delta L_1) \tag{18}$$

Since the formula $$\Delta L_2 \approx \Delta L_1 \tag{19}$$

is satisfied, the formula (18) can be rewritten as follows:

$$L_{02} - L_{01} \approx L_2 - L_1 \tag{20}$$

The distance $\Delta Y_a$ between the rear edges $E_2$ and $T_2$ in FIG. 1A and the interval $\Delta X_a$ between the front edges $E_1$ and $T_1$ in FIG. 1B are expressed, respectively, as follows:

$$\Delta X_a \approx (L_2 - L_1) - (R_2 - R_1) - \Delta Y \tag{21a}$$

$$\Delta Y_a \approx (L_2 - L_1) - (R_2 - R_1) - \Delta Y \tag{21b}$$

These expressions can be also modified with the formulae (17) and (20) as follows:

$$\Delta X_a \approx (\Delta L_{2max} - \Delta L_{1min}) + \Delta X$$

$$\Delta Y_a \approx (\Delta L_{2max} - \Delta L_{1min}) + \Delta Y \tag{22}$$

The formula (22) means as follows: First, since the following formula (23) is generally satisfied, $$\Delta L_{2max} > \Delta L_{1min} \tag{23}$$

the following formulae (24a) and (24b) are obtained:

$$\Delta X_a > \Delta X \tag{24a}$$

$$\Delta Y_a > \Delta Y \tag{24b}$$

As understood from the following formulae (24a) and (24b), the intervals $\Delta X_a$ and $\Delta Y_a$ are larger than the margins $\Delta X$ and $\Delta Y$, respectively. In other words, the length of the cathode electrode 5a is shorter than the case shown in FIG. 5. This is one of the results coming about from making the mask $M_2$ commonly available for substrates of different warping amounts. However, a reduction:

$$\Delta L_{2max} - \Delta L_{1min} \tag{25}$$

in the length of the electrode 5a in FIG. 5 takes the minimum demand as value. This is for the following reasons.

The value expressed in formula (25) is in proportion to the allowable range, or the difference between the allowable maximum value and the estimated minimum value, of the warping of the substrate 10. For example, when the estimated minimum value is relatively close to the allowable maximum value, the value of the formula (25) becomes small. In other words, when the range of the warping is small, a reduction in the length of the electrode 5a becomes accordingly small. On the contrary, when the allowable range of the warping keeps large, the value of the formula (25) becomes large, and therefore, the misregistration of the patterns can be effectively avoided for such a wide range of warping.

The reduction in the length of the electrode 5a takes minimum values in accordance with respective conditions. As a result, the situation that concentration of current due to an excessive shortening of the electrode 5a causes heating-up can be avoided.

The margins $\Delta X$ and $\Delta Y$ have nearly same values, and a margin t in a direction of the shorter sides of the n-emitter region 14a and cathode electrode 5a in FIGS. 1A and 1B is also of almost the same value as the margins $\Delta X$ and $\Delta Y$.

(B-3) Example of Values

Next, examples of values are presented for embodying the above-mentioned principle. First, assume that the horizontal distance $L_{02}$ from the center C to the rear edge $T_{02}$ in FIG. 4 is 20 mm, the allowable maximum value of the warping amount $D_2$ is 500 μm, and the estimated minimum value of the same is 50 μm. As $(\theta_2/2)$ in the formula (9) is sufficiently small, the following formula is held:

$$\tan(\theta_2/2) \approx \theta_2/2 \approx (\tan\theta_2)/2 = D_2/(2L_2) \approx D_2/(2L_{02}) \tag{26}$$

Assuming that the misregistration amount $\Delta L_2$ in the formula (9) corresponding to the allowable maximum value 500 μm of the warping amount $D_2$ is $\Delta L_{2max}$ and that the misregistration amount $\Delta L_2$ corresponding to the estimated minimum value 50 μm is $\Delta L_{2min}$, the following formulae are obtained from the formulae (9) and (26):

$$L_{2max} \approx 0.5 \times \{0.5/(2 \times 20)\} = 6.25 \times 10^{-3} \text{ [mm]} \tag{27}$$

$$L_{2min} \approx 0.05 \times \{0.05/(2 \times 20)\} = 6.25 \times 10^{-6} \text{ [mm]} \tag{28}$$

Thus, according to the formula (13), the rear edge $ME_2$ may be located the following distance $R_2$ away from the center C in the mask $M_2$ (FIG. 1C) when the cathode electrodes 5a through 5c are formed:

$$R_2 = 20 - 6.25 \times 10^{-3} - \Delta Y \text{ [mm]} \tag{29}$$

When the mask $M_1$ for forming the n-emitter region is employed as a reference positions, the rear edge $ME_2$ in the mask $M_2$ for forming the electrodes is located the distance:

$$6.25 \times 10^{-3} + Y \text{ [mm]} \tag{30}$$

nearer to the center C from the rear edge $ME_2$ of the pattern in the mask $M_1$. Consequently, the rear edge $E_2$ comes in position away from the rear edge $T_2$ of the n-emitter region 14a by the margin $\Delta Y$ after the substrate is warped (see FIG. 1B). The misregistration amount $\Delta L_{2min}$ corresponding to the estimated minimum value 50 μm is not employed when the position of the rear edge $ME_2$ is determined.

On the other hand, when the position of the front edge $ME_1$ is determined, the position is corrected in accordance with the estimated minimum value of the warping amount, as has been described. Each of the n-emitter regions 14a through 14c of the GTO 100 is several millimeters or below in length, and since the edges $T_1$ and $T_2$ are relatively close to each other on the substrate 10, the values of parameters on the front edge $E_1$ are almost the same as those on the rear edge $E_2$.

Thus, obtained are formulae in which the suffix "2" in the formulae (26) through (29) is replaced with the suffix "1" and $(-\Delta Y)$ is replaced with $(+\Delta X)$. Further, with the estimated minimum value $\Delta L_{1min}$ of the misregistration amount corresponding to the formula (28), the front edge $E_1$ in the mask $M_2$ for forming the electrodes is set at a position nearer to the center C from the front edge $MT_1$ in the reference mask $M_1$ by about the following distance:

$$6.25 \times 10^{31\ 6} - \Delta X \text{ [mm]} \tag{31}$$

As is understood by the formulae (30) and (31), a correction ratio $a_2$ of the position of the rear edge $ME_2$ of the mask $M_2$ from a reference case where the substrate 10 is not warped is obtained as the following equation (33) under the approximation (32):

$$L_{02} - \Delta Y \approx L_{02} \tag{32}$$

$$\begin{aligned} a_2 &= \Delta L_{2max}/(L_{02} - \Delta Y) \\ &\approx \Delta L_{2max}/L_{02} \\ &= 6.25 \times 10^{-3}/20 \\ &\approx 3.13 \times 10^{-4} \\ &= 0.0313 [\%] \end{aligned} \tag{33}$$

A correction ratio $a_1$ on the front edge $ME_1$ similarly is approximately obtained as follows:

$$\begin{aligned} a_1 &= \Delta L_{1min}/(L_{01} - X) \\ &\approx \Delta L_{2min}/L_{02} \\ &= 6.25 \times 10^{-6}/20 \\ &\approx 3.13 \times 10^{-7} \\ &= 0.000313 [\%] \end{aligned} \tag{34}$$

These ratios vary in accordance with the allowable maximum value or the values of the distances $R_1$ and $R_2$ of the warping amount, and an allowable maximum value of the warping commonly allowable in manufacturing various kinds of semiconductor devices is preferably within the following range of the correction:

$$a_1, a_2 \leq 0.1 [\%] \tag{35}$$

When the substrate 10 is warped as much as required to correct beyond the range expressed in the formula (35), the warping is considerably great, and the substrate 10 is often regarded as defective one because of cracking or the like.

Although the correction ratio $a_1$ has different values to the cathode electrodes 5a through 5c, a value selected in approximation within 0.1% may be commonly employed to the front edges of the cathode electrodes 5a through 5c. Similarly, a common value selected within 0.1% may be employed as the correction ration $a_2$ on the rear edges of the cathode electrodes 5a through 5c.

C. Manufacturing Process

FIGS. 7A through 7H are sectional views showing steps of manufacturing the GTO 100 through the patterning according to the above principle. In the sectional views, the right halfs of the GTO 100 and the masks $M_1$ and $M_2$ alone are shown.

Figure 7A:
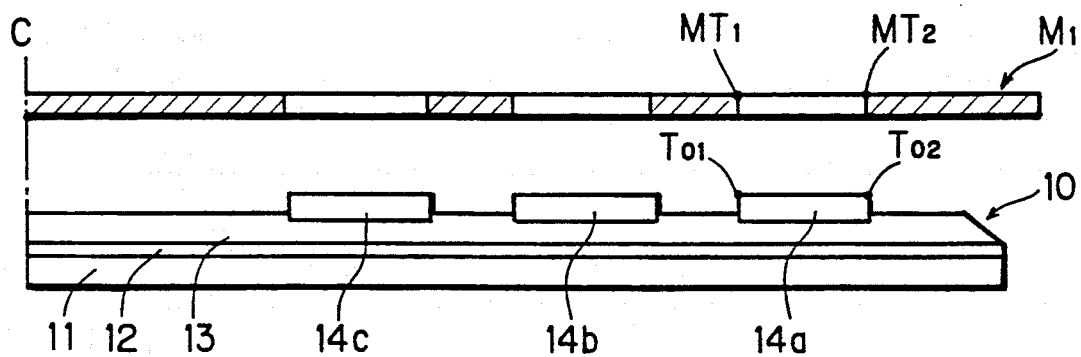
FIGS. 7A through 7H are sectional views showing process steps of manufacturing the GTO according to the preferred embodiment.

First, as shown in FIG. 7A, a three-layer structure of the p-emitter region 11, the n-base region 12 and the p-base region 13 is provided in the substrate 10 by the impurity diffusion to the semiconductor substrate 10 or other treatments. Then, an n-type semiconductor layer is selectively formed in the top major surface of the substrate 10 to obtain the array of the n-emitter regions 14a through 14c. The reference mask $M_1$ is used for patterning the selective formation of the n-emitter regions 14a through 14c. Hence, the front and rear edges $T_{01}$ and $T_{02}$ of the n-emitter region 14a are in agreement in position with the front and rear edges $MT_1$ and $MT_2$ of the pattern on the reference mask $M_1$. This is also true in the remaining n-emitter regions 14b and 14c. The substrate 10 at this stage is substantially flat and not warped, and the n-emitter regions 14a through 14c are patterned with the mask $M_1$ and the substrate 10 keeping parallel to each other.

Figure 7B:
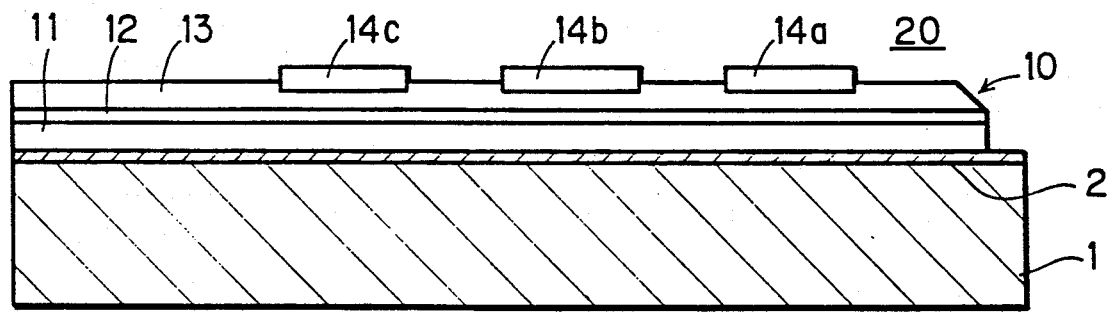

After that, the molybdenum plate 1 is brazed to the bottom major surface of the semiconductor substrate 10 through the anode electrode 2 (FIG. 7B). Upon the brazing process, the anode electrode 2 functions as a brazing material layer. FIG. 7B shows the stage where the members 1, 2 and 10 are high in temperature in the brazing process. Thus, the assembly 20 of the members 1, 2 and 10 is substantially flat.

Figure 7C:
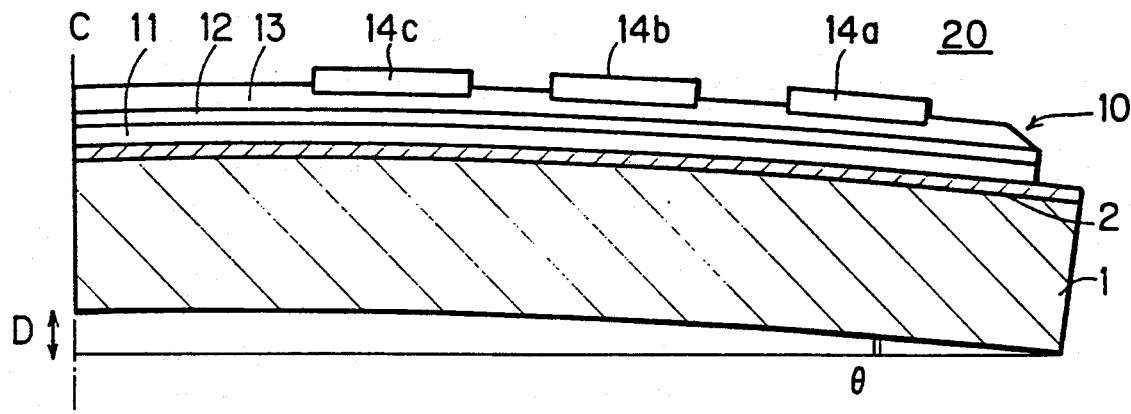

When the assembly 20 is cooled down almost to the room temperature in a next stage of the brazing process, the assembly 20 is warped because of the difference between respective thermal expansion coefficients of the substrate 10 and the molybdenum plate 1 (FIG. 7C). The amount of the warping is expressed by the warping amount D and the inclination angle $\theta$ in FIG. 7C.

Figure 7D:
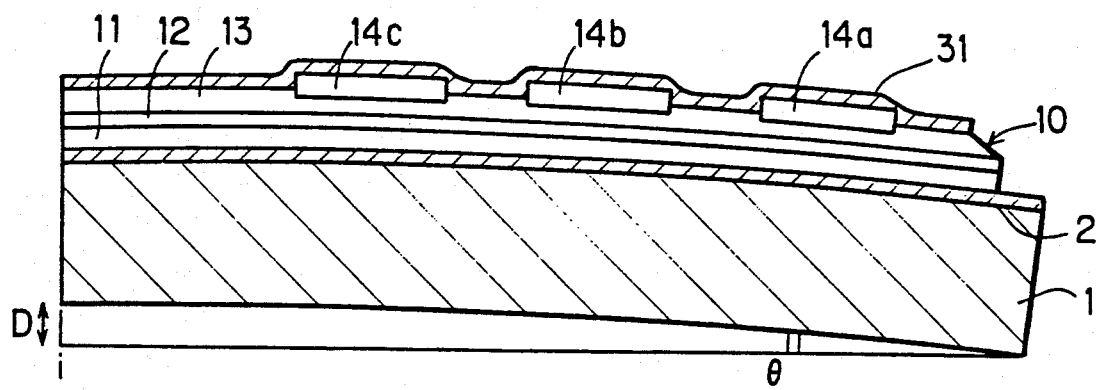
Figure 7E:
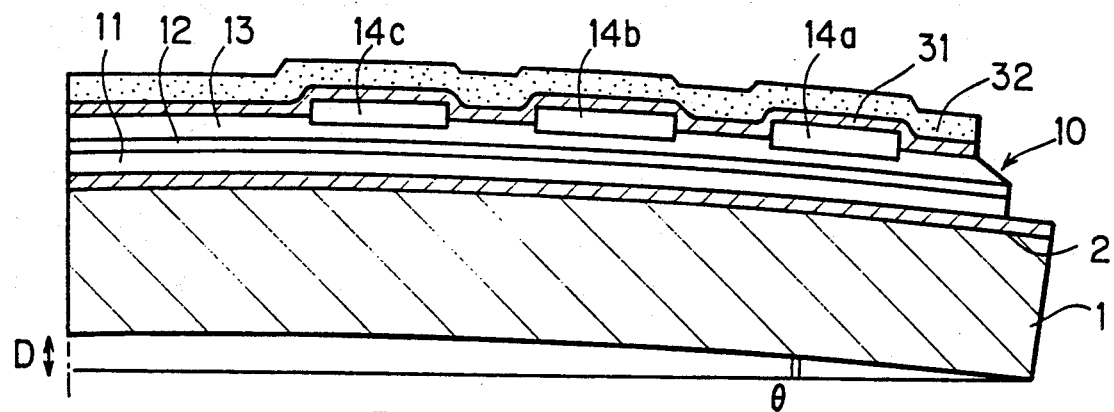

Then, an aluminum layer 31 is formed throughout the top major surface of the substrate 10 (FIG. 7D). Also, a resist layer 32 of negative type is formed over the entire surface of the aluminum layer 31 (FIG. 7E).

Figure 7F:
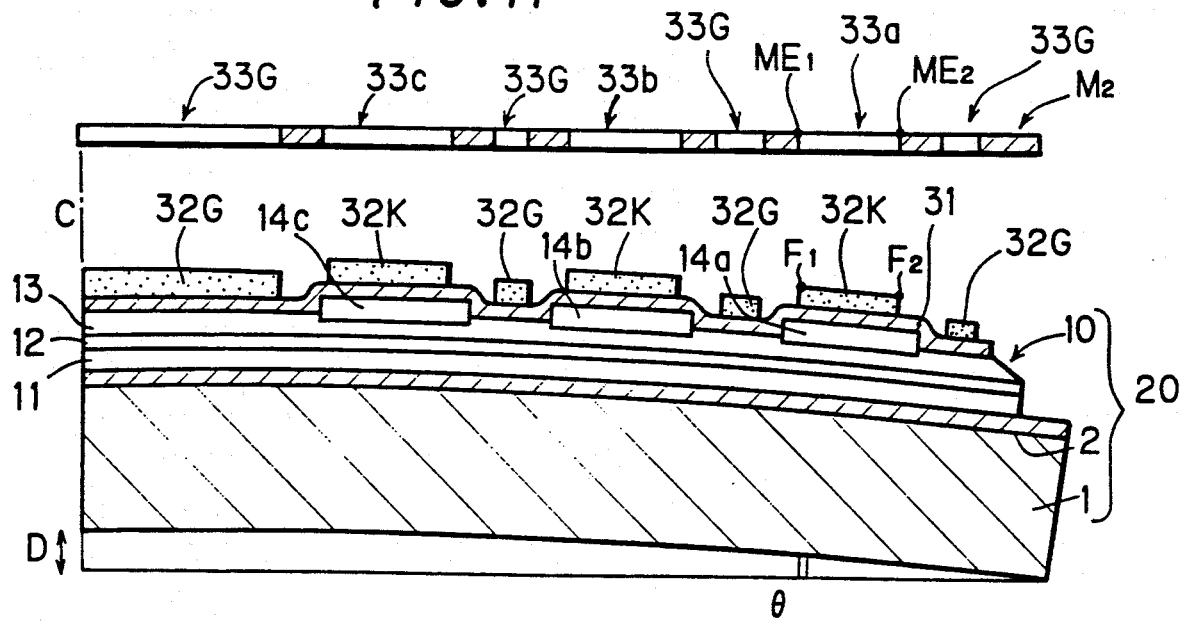
Figure 7G:
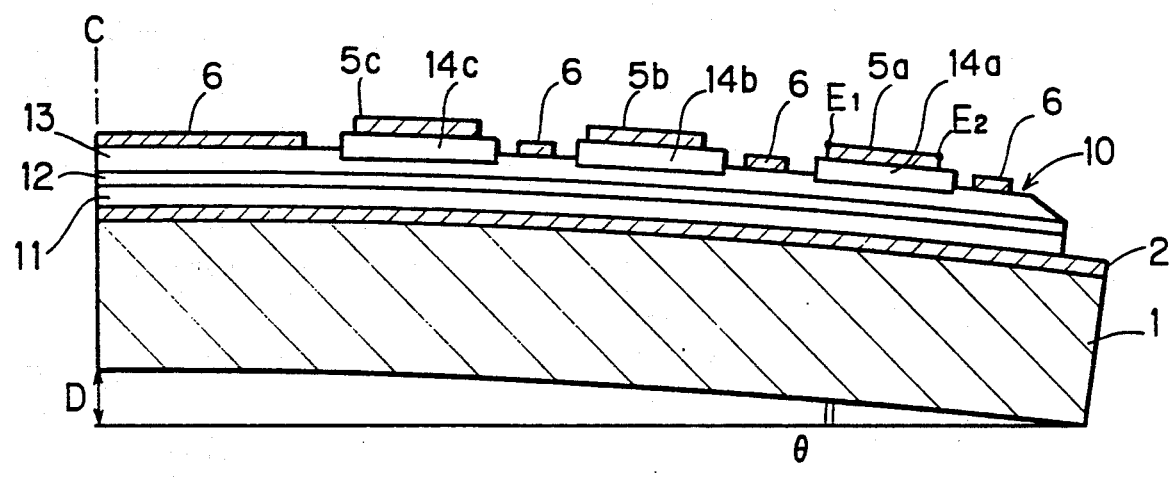

At the next step shown in FIG. 7F, the resist layer 32 is selectively exposed to a light through the mask $M_2$, and after the resist layer 32 is developed, an unexposed portion of the resist layer 32 is removed. The mask $M_2$ has transparent portions 32a through 32c on the n-emitter regions 14a through 14c as well as transparent portions 32G disposed alternately with the transparent portions 32a through 32c. The front and rear edges $ME_1$ and $ME_2$ of the transparent portion 32a in the reference mask $M_1$ are positioned away from the front and rear edges $MT_1$ and $MT_2$ by the distances expressed by the formulae (15) and 16) (FIG. 7A). Front and rear edges $F_1$ and $F_2$ of a resist 32K remaining on the n-emitter region 14a are in agreement in position with the edges $ME_1$ and $ME_2$ on the mask $M_2$.

The way in which the pattern is positioned in the mask $M_2$ can be applied to the transparent portions 33b and 33c on the remaining n-emitter regions 14b and 14c. The amounts $\Delta L_{2max}$ and $\Delta L_{1min}$ employed for positioning the front and rear edges of the transparent portions 33b and 33c are determined in accordance with the allowable maximum value and the estimated minimum value of the warping amount of the substrate 10 at the positions of the n-emitter regions 14b, 14c corresponding to them. As previously mentioned, the correction ratios $a_1$ and $a_2$ may be common ratios in respective front and rear edges, respectively. In practice, satisfactory effects are obtained by the approximate correction employing the common correction ratios.

Also, the opposite edges of the transparent portion 33G are shifted to the center C from the position where the gate electrode is to be formed under the imaginary case that the substrate 10 is flat. The amount of the shifting is also determined in accordance with the allowable maximum value and the estimated minimum value of the warping amount of the substrate 10.

In the patterning process, the orientations of the mask $M_2$ and the substrate 10 are registered at the center C of the substrate 10. The mask $M_2$ is parallel to the major surfaces of the substrate 10 in the center C and not parallel to them anywhere else.

The reason why orientations are registered in the center C is that the correction amount of the position of the pattern on the mask $M_2$ is calculated with the reference of the center C.

It is relatively easy to satisfy the registration conditions on the orientations. This is because the warping of the substrate 10 is symmetrical about the center C, and hence, when the assembly 20 is held on a flat stage, areas around the center C in the substrate 10 becomes parallel to the surface of the flat stage. Thus, the above registration conditions are satisfied by keeping the flat mask $M_2$ parallel to the surface of the stage.

Then, the aluminum layer 31 is selectively etched with the resists 32K and 32G, and thereafter the resists 32K and 32G are removed. Through such a photolithography process, the aluminum layer 31 is patterned to form the cathode electrodes 5a through 5c and the gate electrode 6 shown in FIG. 7G. Since the pattern edges $ME_1$ and $ME_2$ in the mask $M_2$ are corrected allowing for the warping of the substrate 10, the edges $E_1$ and $E_2$ of the cathode electrode 5a do not extend out beyond the n-emitter region 14a. This is also true in the remaining cathode electrodes 5b and 5c. Also, the gate electrodes 6 are formed in positions corrected allowing for the warping of the substrate 10.

Figure 7H:
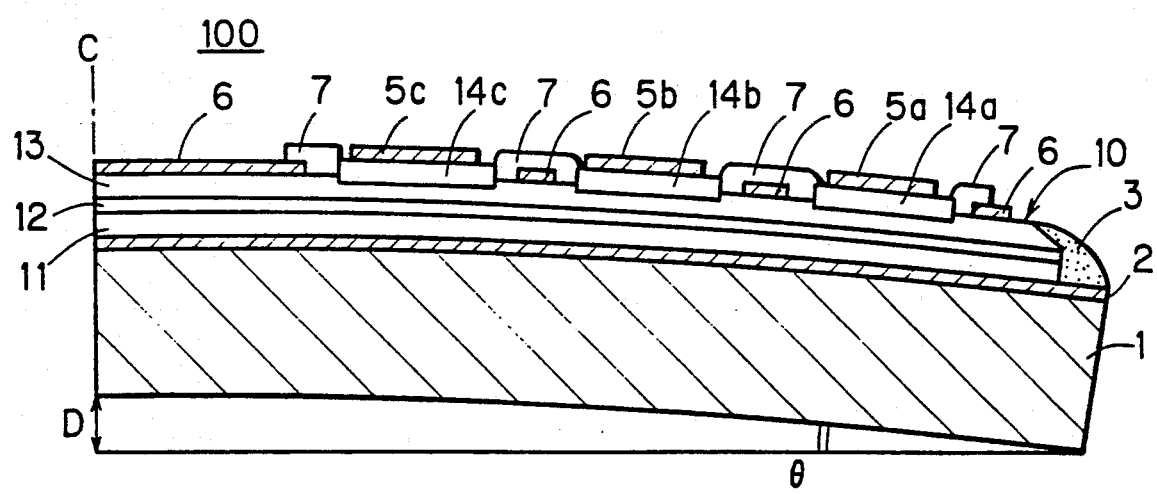
Figure 8:
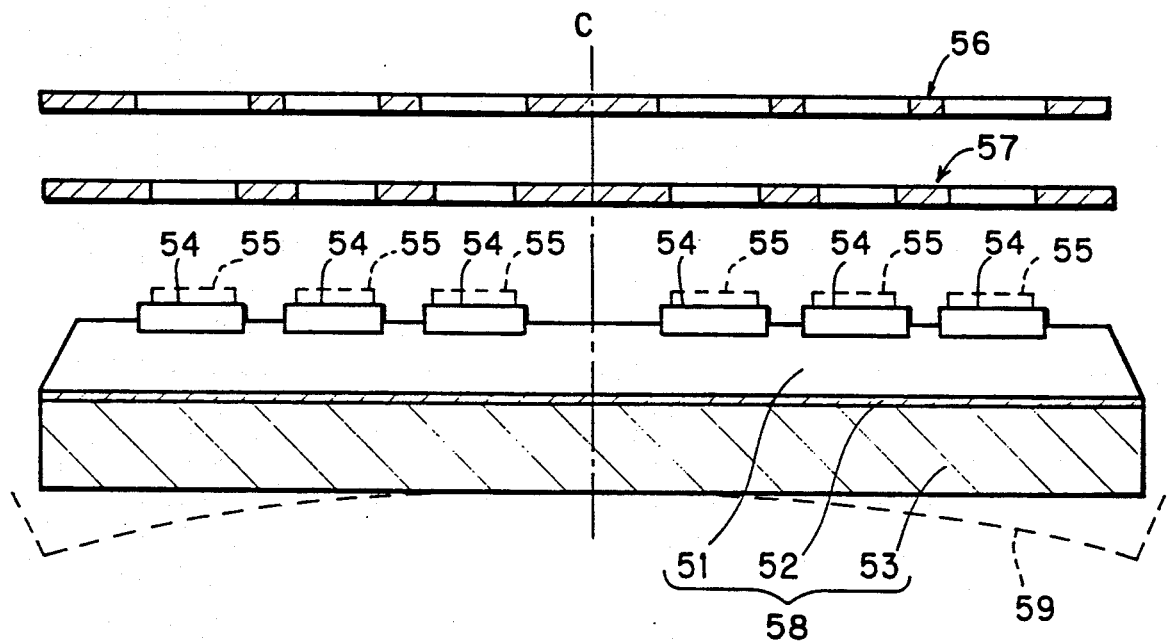
FIG. 8 is a diagram showing an exemplary situation of the pattern formation.
Figure 9:
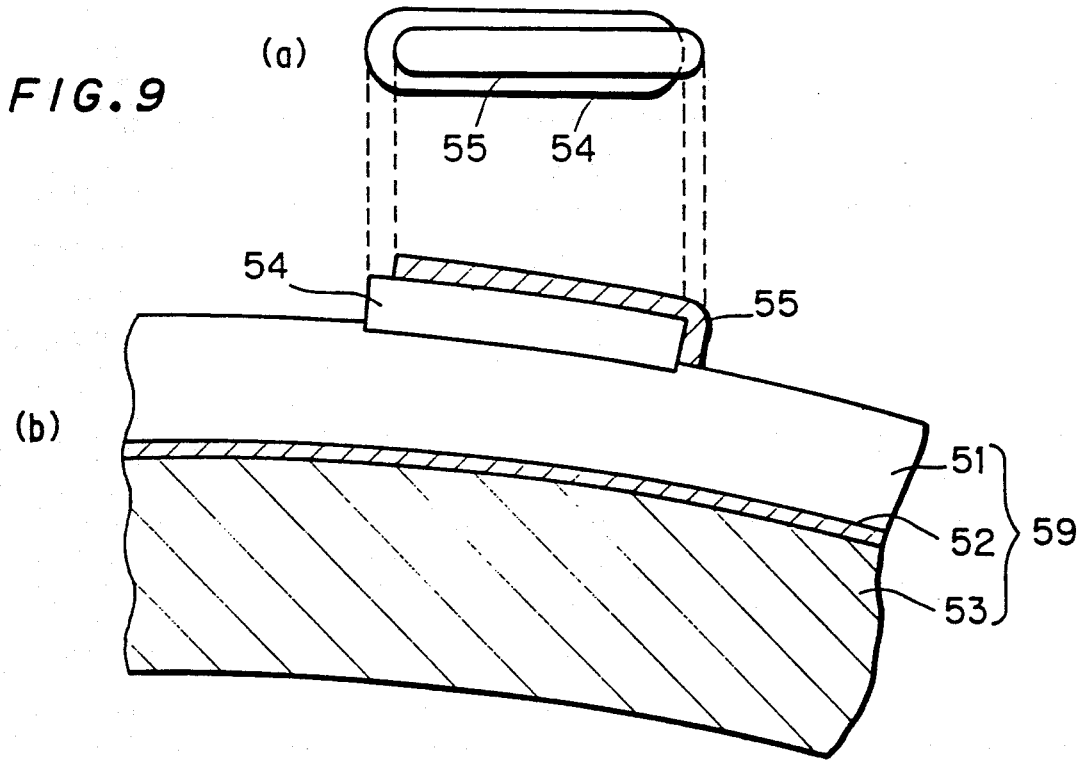
FIG. 9 is a sectional view showing the disagreement in position of patterns caused in a conventional patterning method.

After that, as shown in FIG. 7H, the insulating film 7 and the silicone rubber layer 3 are formed. Also in a mask (not shown) for patterning the insulating film 7, the position of the pattern edges are corrected in accordance with the allowable maximum value and the estimated minimum value of the warping amount of the substrate 10. Common values may be employed as the correction ratios of the edge positions in the gate electrodes 6 and the insulating film 7, similarly to the process steps of forming the cathode electrodes 5a through 5c.

Through the above-mentioned process, the GTO 100 as shown in FIG. 3A can be obtained. Even if the substrate 10 is warped as great as shown in FIG. 3B, the cathode electrodes 5a through 5c formed by employing the mask $M_2$ shown in FIG. 7 do not extend out beyond the n-emitter regions 14a through 14c. A misregistration to an extent that the cathode electrodes 5a through 5c do not extend out beyond the emitter electrodes 14a through 14c is in an allowable error, and hence there is no problem with such misregistration.

D. Other Applications

The method according to the present invention can be used for manufacturing various semiconductor devices, such as thyristors other than GTOs, transistors, diode elements and the like. The present invention can be also applied to patterning of substrates for integrated circuits.

The present invention is effective to all the cases in which the substrate is anyway warped during a processing, as well as the case in which the substrate is warped because of brazing to a hard metal plate, such as a molybdenum plate, a tungsten plate and the like. The "metal plate" is not limited to a plate made of a single metal but may be an alloy plate, a plate having a metal layer and made of compound material, or the like.

The registration of the orientations of the warped substrate and the mask is preferably carried out with regard to the center of the substrate, but the present invention is also applicable to the case in which the registration of the orientations is carried out with regard to a position other than the center of the substrate. In this case, the correction amount of the pattern on the mask is determined with the reference of the position selected.

"Mask" in this invention is not limited to a photomask and an electron ray mask, but may be mask data for modulating when the substrate is scanned by ON/OFF-modulated beam irradiation to pattern.

Although the present invention has been described and illustrated in detail, it is clearly understood that the same is by way of illustration and example only and is not to be taken by way of limitation. The spirit and scope of the present invention should be limited only by the terms of the appended claims.

We claim:

1. A method of forming a material pattern on a major surface of a warped substrate, comprising the steps of:
    (a) determining an allowable limit value of warp in said substrate;
    (b) determining a position of a region on said major surface at which said material pattern is to be formed under an imaginary condition that said substrate is flat;
    (c) determining a reference position on said major surface of said substrate;
    (d) correcting said position of said region as a function of said allowable limit value and a distance between said region and said reference position to thereby determine a corrected position of said region;
    (e) obtaining a mask having a mask pattern at a position corresponding to said corrected position;
    (f) forming a material layer on said major surface of said substrate; and
    (g) patterning said material layer with said mask while adjusting respective orientations of said material layer and said mask at said reference position to thereby obtain said material pattern on said major surface.

2. The method of claim 1, wherein
the step (a) comprises the steps of:
    (a-1) determining an allowable maximum value of warp in said substrate; and
    (a-2) estimating a minimum value of warp in said substrate to obtain an estimated minimum value;
    whereby said allowable limit value of warp is obtained in the form of a combination of said allowable maximum value and said estimated minimum value.

3. The method of claim 2, wherein
said material pattern has a front edge facing to said reference position and a rear edge opposite to said front edge;
    said mask pattern has a first edge corresponding to said front edge and a second edge corresponding to said rear edge;
    said position of said region is represented by respective positions of said first and second edges; and
    the step (d) comprises the steps of:
    (d-1) correcting a position of said first edge as a function of said estimated minimum value and a distance between said position of said first edge and said reference position to thereby obtain a corrected position of said first edge; and
    (d-2) correcting a position of said second edge as a function of said allowable maximum value and a distance between said position of said second edge and said reference position to thereby obtain a corrected position of said second edge;
    said corrected position of said region being represented by said corrected positions of said first and second edges.

4. The method of claim 3, wherein
the step (d-1) comprises the step of:
    (d-1-1) correcting said position of said first edge toward said reference position.

5. The method of claim 4, wherein
the step (d-2) comprises the step of:
    (d-2-1) correcting said position of said second edge away from said reference position.

6. A method of forming a material pattern on a major surface of a warped substrate, said material pattern including a plurality of unit patterns, said method comprising the steps of:
    (a) determining an allowable limit value of warp in said substrate;
    (b) determining respective positions of a plurality of regions on said major surface at which said plurality of unit patterns are to be formed, respectively, under an imaginary condition that said substrate is flat;
    (c) determining a reference position on said major surface of said substrate;
    (d) correcting said respective positions of said plurality of regions as a function of said allowable limit value and respective distances between said plurality of regions and said reference position to thereby determine respective corrected positions of said plurality of said regions;
    (e) obtaining a mask having a plurality of unit mask patterns at positions corresponding to said respective corrected positions;
    (f) forming a material layer on said major surface of said substrate; and
    (g) patterning said material layer with said mask while adjusting respective orientations of said material layer and said mask at said reference position to thereby obtain said material pattern including said plurality of unit patterns on said major surface.

7. The method of claim 6, wherein
the step (a) comprises the steps of:
    (a-1) determining an allowable maximum value of warp in said substrate; and
    (a-2) estimating a minimum value of warp in said substrate to obtain an estimated minimum value;
    whereby said allowable limit value of warp is obtained in the form of a combination of said allowable maximum value and said estimated minimum value.

8. The method of claim 7, wherein
each of said plurality of unit patterns has a front edge facing to said reference position and a rear edge opposite to said front edge;
    each of said plurality of unit mask patterns has a first edge corresponding to said front edge and a second edge corresponding to said rear edge;

each of said respective positions of said plurality of regions is represented by respective positions of said first and second edges; and the step (d) comprises the steps of:

(d-1) correcting a position of said first edge as a function of said estimated minimum value and a distance between said position of said first edge and said reference position to thereby obtain a corrected position of said first edge; and (d-2) correcting a position of said second edge as a function of said allowable maximum value and a distance between said position of said second edge and said reference position to thereby obtain a corrected position of said second edge;

said respective corrected positions of said plurality of regions being represented by said corrected positions of said first and second edges.

9. The method of claim 8, wherein
the step (d-1) comprises the step of:
(d-1-1) correcting said position of said first edge toward said reference position.

10. The method of claim 9, wherein
the step (d-2) comprises the step of:
(d-2-1) correcting said position of said second edge away from said reference position.

11. The method of claim 10, wherein
the step (d-1-1) comprises the step of:
correcting respective distances between said reference position and respective positions of first edges in said plurality of unit mask patterns at a first constant correction ratio.

12. The method of claim 11, wherein
the step (d-2-1) comprises the step of:
correcting respective distances between said reference position and respective positions of second edges in said plurality of unit mask patterns at a second constant correction ratio.

13. A method of manufacturing a semiconductor device, comprising the steps of:

(a) preparing first and second masks on which first and second masking patterns are formed;

(b) forming a first material pattern on a top major surface of a semiconductor substrate using said first mask;

(c) brazing a bottom major surface of said semiconductor substrate on a metal plate, in which said semiconductor substrate is warped due to a difference between respective thermal expansion coefficients of said semiconductor substrate and said metal plate; and (d) forming a second material pattern on said top major surface of said semiconductor substrate using said second mask, said second material pattern being adjusted to said first material pattern in position;

wherein the step (a) comprises the steps of:

(a-1) determining, with reference to said first masking pattern in said first masking pattern, a position of a region in said top major surface on which said second material pattern is to be formed;

(a-2) correcting said position of said regions a function of a predetermined allowable limit value of warp in said semiconductor substrate and a distance between said region and a predetermined reference position ton said top major surface to thereby determine a corrected position of said region; and (a-3) obtaining said second mask in which said masking pattern represents said corrected position of said region; and the step (d) comprises the steps of:

(d-1) forming a material layer on said top major surface; and (d-2) patterning said material layer with said second mask while adjusting respective orientations of said material layer and said second mask at said reference position.

14. The method of claim 13, wherein
the step (a-2) comprises the steps of:
(a-2-1) determining an allowable maximum value of warp in said semiconductor substrate; and
(a-2-2) estimating a minimum value of warp in said semiconductor substrate to obtain an estimated minimum value;
whereby said allowable limit value of warp is obtained in the form of a combination of said allowable maximum value and said estimated minimum value.

15. The method of claim 14, wherein
said second material pattern has a front edge facing to said reference position and a rear edge opposite to said front edge;
said second mask pattern has a first edge corresponding to said front edge and a second edge corresponding to said rear edge;
said position of said region is represented by respective positions of said first and second edges; and
the step (a-2) comprises the steps of:
(a-2-1) correcting a position of said first edge as a function of said estimated minimum value and a distance between said position of said first edge and said reference position to thereby obtain a corrected position of said first edge; and
(a-2-2) correcting a position of said second edge as a function of said allowable maximum value and a distance between said position of said second edge and said reference position to thereby obtain a corrected position of said second edge;
said corrected position of said region being represented by said corrected positions of said first and second edges.

16. The method of claim 15, wherein
the step (a-2-1) comprises the step of:
correcting said position of said first edge toward said reference position.

17. The method of claim 16, wherein
the step (a-2-2) comprises the step of:
correcting said position of said second edge away from said reference position.

* * * * *